(12) United States Patent
Mukai et al.

(10) Patent No.: US 6,303,251 B1
(45) Date of Patent: Oct. 16, 2001

(54) MASK PATTERN CORRECTION PROCESS, PHOTOMASK AND SEMICONDUCTOR INTEGRATED CIRCUIT DEVICE

(75) Inventors: Kiyohito Mukai, Habikino; Hidenori Shibata, Shijonawate; Hiroyuki Tsujikawa, Kusatsu, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/360,989

(22) Filed: Jul. 27, 1999

(30) Foreign Application Priority Data

Jul. 29, 1998 (JP) .................................................. 10-213859

(51) Int. Cl.$^7$ ...................................................... G03F 9/00
(52) U.S. Cl. ..................................... 430/5; 430/9; 430/30
(58) Field of Search ......................................... 430/5, 30, 9

(56) References Cited

U.S. PATENT DOCUMENTS

| 4,895,780 | 1/1990 | Nissan-Cohen et al. | 430/5 |
| 5,208,124 | 5/1993 | Sporon-Fiedler et al. | 430/5 |

FOREIGN PATENT DOCUMENTS

| 580486 | 4/1993 | (JP) . |
| 8306608 | 11/1996 | (JP) . |

*Primary Examiner*—Christopher G. Young
(74) *Attorney, Agent, or Firm*—Stevens, Davis, Miller & Mosher, LLP

(57) ABSTRACT

In order that CAD processing time required for modifying an input design pattern to compensate for optical proximity effects is reduced, increases in the number of base shapes when corrected data are converted into EB data are restricted, and false detection of defects in a photomask inspection process is restricted, the following steps are taken. At a shape selection step, rectangular shapes are divided into a dense rectangular shape group and a non-dense rectangular shape group according to the distance of each rectangular shape to an adjacent rectangular shape. At a number-of-shapeas comparison step, the number of shapes included in the dense rectangular shape group is compared to the number of shapes included in the non-dense rectangular shape group to select either shape group for correction. At a correction process selection step, a correction process suited for the selected shape group is selected. At a shape correction step, optical proximity correction is made. At a shape combining step, a group of corrected shapes and the rectangular shape group different from the selected one are combined.

12 Claims, 11 Drawing Sheets

F I G. 1
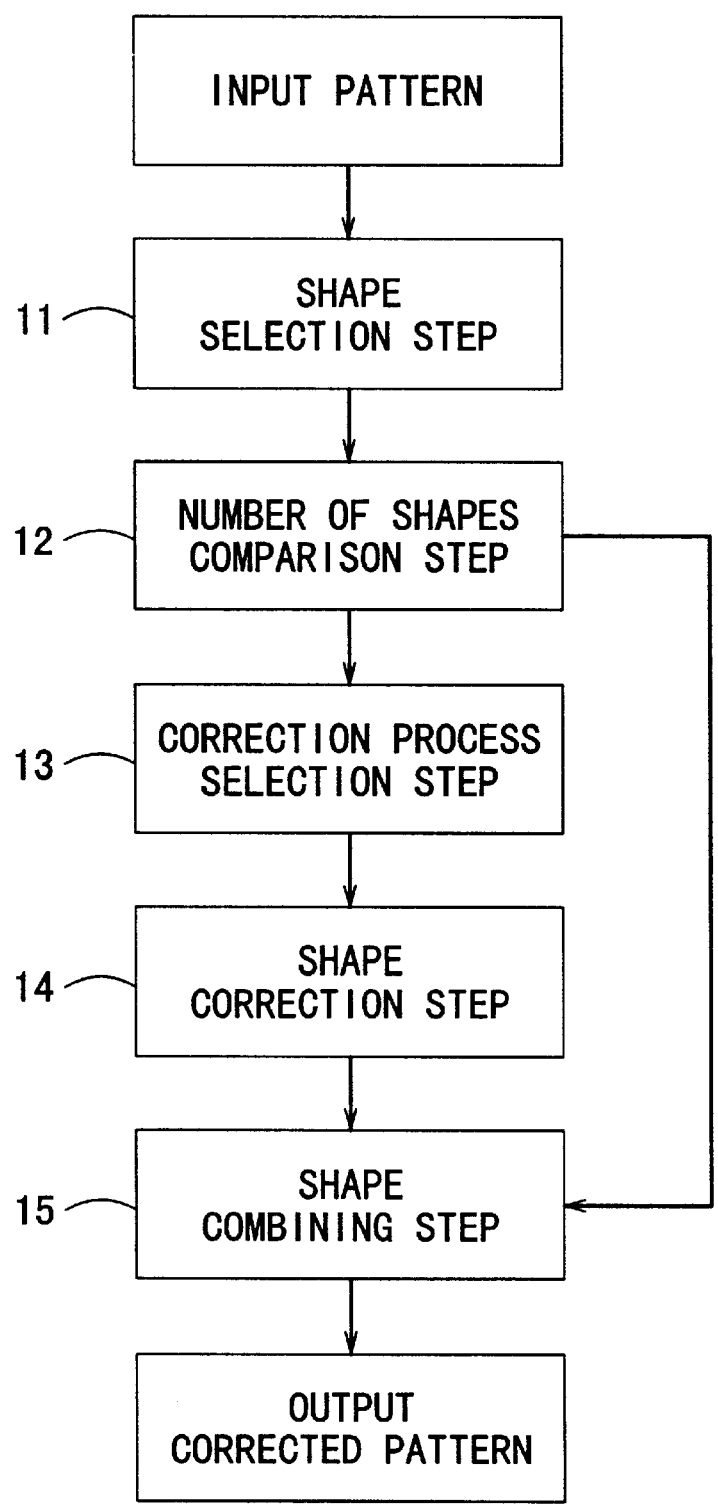

MASK PATTERN CORRECTION PROCESS, PHOTOMASK AND SEMICONDUCTOR INTEGRATED CIRCUIT DEVICE

BACKGROUND OF THE INVENTION

1. Field of the Invention

The present invention relates to a mask pattern correction process for making corrections, beforehand, on a mask geometric pattern for use in the manufacture of semiconductor integrated circuit devices or the like in order to obtain a transferred image that is close to a desired design pattern. The invention also relates to photomasks having mask patterns corrected by the above mask pattern correction method. Further, the invention relates to semiconductor integrated circuit devices manufactured by use of photomasks having mask patterns corrected by the above mask pattern correction method.

2. Prior Art

A photolithographic process is essentially involved in the current manufacture of semiconductor integrated circuit devices and the like. A predominate photolithographic process is such a process that a semiconductor mask pattern created with the aid of a computer assisted design (CAD) system is transferred onto a resistmaterial on the substrate of a semiconductor device, using an exposure light source.

With the recent trend toward smaller semiconductor integrated circuit devices, design rules are becoming increasingly smaller. As smaller design rules are sought, lithography needs to be carried out in the proximity of a limit of wavelength of the light source in the exposure system. This has lead to decreases in the resolution of the exposure system and, in consequence, mask patterns after transferring are deviated from their original design patterns.

One of causes of such deviation in pattern is "optical proximity effects". These effects area phenomenon in which the diffraction and interference of light occur when a mask pattern is transferred onto a light-sensitive film applied to a wafer, using exposure light which has passed through the patterned openings of a mask, so that the mask pattern cannot be correctly imaged on the wafer. This phenomenon results in degradation of the mask pattern after transferring onto the wafer.

As an actual phenomenon, the optical proximity effects can be divided into two effects, that is, a self-light proximity effect and mutual-light proximity effect. The self-light proximity effect causes size reduction in isolated patterns so that they become smaller than their design values as shown in FIG. 9(a), whereas the mutual-light proximity effect causes size expansion in two patterns adjacent to each other so that they become greater than their initial patterns as shown in FIG. 9(b). In FIG. 9, the rectangular shapes indicated by broken lines each represent a mask pattern and tile hatched portions each represent a pattern which has been transferred onto a wafer. The self-light proximity effect illustrated:in FIG. 9(a) is caused by the diffraction of light and affects the vertices and their neighborhoods of a rectangular shape, resulting in a shrunk pattern. The mutual-light proximity effect illustrated in FIG. 9(b) is caused mainly by the interference of light and the close parts of two patterns become further closer to each other under the influence of light interference after transferring.

If such differences in pattern are caused, there often arise the problems of poor device performance and geometric defects such as erroneous contact between shapes, because of mask pattern distortion after transferring.

As an attempt to counter such geometric pattern defects, correction techniques by use of assist shapes have been extensively studied. These techniques are generally called "Optical Proximity Correction" (hereinafter referred to as "OPC"). OPC is sometimes used for explaining techniques for compensating for pattern degradation in non-optical pattern transferring such as etching.

One known OPC technique is disclosed in Japanese Patent Publication (KOKAI) GazetteNo. 5-80486 (1993). A conventional OPC technique is typically carried out in the following way. Based on degrees of pattern distortion observed in tests of transferring a design pattern onto a wafer or based on degrees of pattern distortion observed in simulations in which various luminous intensities are applied to the design pattern, corrected shapes are created by adding a plurality of modifying shapes to an original design pattern or by deleting parts from an original design pattern. Then, transferring tests are conducted with the corrected shapes. Modifying shape data which provides a transferred pattern most closest to the original design pattern is searched for in the above transferring tests. With the obtained data, actual corrections are made by altering or partially deleting the original design pattern, by use of a CAD program.

FIG. 10(a) shows an example of pattern correction performed on the isolated shape shown in FIG. 9(a), using a CAD program, whereas FIG. 10(b) show; an example of pattern correction performed on the close shapes shown in FIG. 9(b), using a CAD program. The example shown in FIG. 10(a) is an example in which modifying graphic data (hatched portion) is added. The example shown in FIG. 10(b) is an example in which parts (indicated by broken lines) are deleted from a design pattern to produce a corrected pattern.

In an electron beam exposure system, drawing is carried out with base shapes (rectangles) in view of its characteristics. Therefore, when converting a design pattern which has undergone optical proximity correction into electron beam exposure data (hereinafter referred to as "EB data") to be used in exposure mask preparation, it is necessary to divide polygons which constitute the design pattern into a plurality of base shapes. A design pattern is represented by a plurality of polygons, and as the order of each polygon is higher (i.e., the number of vertices in each polygon increases), the number of base shapes into which the design pattern is divided increases.

One example of methods for dividing a design pattern into base shapes is disclosed in Japanese Patent Publication (KOKAI) Gazette No. 8-306608 (1996). FIG. 11(a) shows an isolated shape. FIG. 11(b) shows one example of corrected patterns obtained by correcting the shape shown in FIG. 11(a) with a conventional technique and then dividing the corrected shape into base shapes. The broken lines each represent a parting line. In this example, the number of base shapes has increased from one to seven.

FIG. 11(c) represents two rectangular shapes close to each other. FIG. 11(d) shows one example of corrected patterns obtained by correcting the shape shown in FIG. 11(c) with a conventional technique and then dividing the corrected shape into base shapes. The broken line search represent a parting line. In this example, the number of base shapes has increased from two to four.

The above-described conventional processes reveal the following disadvantage. Specifically, for transferring a mask pattern onto a silicon wafer, an original design pattern is not simply used as a transfer mask pattern but a transfer mask pattern is newly produced taking into account the optical proximity effects which may occur during mask pattern transferring. However, if such a technique is applied to all the geometric shapes contained in a mask pattern as is done conventionally, a tremendous number of steps and long processing time become necessary.

Recent semiconductor integrated circuit devices typically represented by ASIC (application specific integrated circuits) include many irregular design patterns and if the above technique is applied to all the geometric shapes for such an integrated circuit, an immense number of corrected patterns will be involved. Therefore, the above technique cannot be suitably applied to actual correction.

In addition, a mask pattern is generally represented by polygons and if modifying shapes are added to or partial deletion is performed with respect to a design pattern, new vertices appear in a polygon, so that the mask pattern after correction is of higher order and has more complexity than the initial design pattern.

When converting the corrected design pattern into EB data by dividing it into base shapes, an increased number of base shapes are involved, because the corrected design pattern is represented by polygons which are of higher order than the polygons of the initial design pattern. In addition, since a pattern is written on a photomask by base shapes, an increased number of base shapes leads to prolonged writing time.

Thus, the conventional technique requires processing time for design pattern correction. Further, it disadvantageously prolongs not only the time required for converting a design pattern into EB data but also the time required for writing a pattern on a photomask in exposure mask preparation.

Additionally, when a mask pattern including many minute modifying shapes is converted into a pattern for use in an exposure system, a vast amount of data is involved which sometimes exceeds the processing capacity of an exposure system.

Another disadvantage of the conventional technique is such that compare check is difficult to make in a defect inspection process, because the original design pattern is not faithfully reproduced on the photomask formed with a corrected pattern. The reason for this is that mask patterns formed as assist shapes include minute level differences smaller than the minimum dimension. Although such level differences should be inspected as distinguished from the defects of the photomask, the currently developed defect testers cannot provide such high-accuracy inspection. It is therefore essential that generation of such unnecessary minute shapes should be avoided and that if minute shapes are generated, they should be deleted.

SUMMARY OF THE INVENTION

Accordingly, it is a first object of the invention to provide a mask pattern correction process which is capable of correcting a design layout pattern for semiconductor devices at high speed to produce a photomask pattern for use in the manufacture of semiconductor devices.

It is a second object of the invention to provide a mask pattern correction process which does not produce patterns including minute level differences which may be erroneously detected during defect inspection.

According to a first invention, there is provided a mask pattern correction process comprising an exposure amount determination step, a projected line detection step and a corrected shape producing step.

At the exposure amount determination step, exposure conditions for a semiconductor device fabrication process are set to a specified exposure amount which permits a non-dense rectangular shape group to properly form a desired pattern, the non-dense rectangular shape group being constituted by non-dense rectangular shapes out of all rectangular shapes included in a layout design pattern, the non-dense rectangular shapes being such shapes each located at a distance from another rectangular shape which distance is more than or equal to a specified shape-to-shape distance.

At the projected line detection step, a dense rectangular shape group, which is constituted by dense rectangular shapes out of all rectangular shapes included in the layout design pattern, is determined to be an object rectangular shape group, the dense rectangular shapes being such shapes each located at a distance from another rectangular shape which distance is less than the specified shape-to-shape distance. Then, projected line segments of directly opposed adjacent side portions lying on the opposed adjacent sides of every two object rectangular shapes are detected, the two object rectangular shapes being close to each other and being included in the object rectangular shape group.

At the corrected shape producing step, if the length of the projected line segments is more than or equal to a specified value, a corrected rectangular shape is produced by parallel movement of the opposed adjacent sides on which the projected line segments lie by a specified correction amount in a direction that the object rectangular shapes are reduced.

According to the above process, projected line segments of directly opposed adjacent side portions lying on the opposed adjacent sides of every two object rectangular shapes are detected, the two object rectangular shapes being close to each other and being included in the dense rectangular shape group which is an object rectangular shape group. If the length of the projected line segments is more than or equal to a specified length, the opposed adjacent sides on which the line segments lie are moved in parallel by a specified correction amount in a direction that the object rectangular shapes are reduced, whereby a corrected rectangular shape is produced. Then, exposure conditions are set to a specified exposure amount which permits the non-dense rectangular shape group which is a non-object rectangular shape group to properly form a desired pattern. With this arrangement, optical proximity correction can be carried out at high speed without increasing the number of base shapes after EB data conversion and without generating shapes including small differences in level.

In addition, optical proximity effects, which occur in the non-dense rectangular shape group and in the dense rectangular shapes having the lengths of line segments less than the specified length, can be compensated for by properly setting exposure conditions, and therefore there is no need to carry out shape correction for them. Accordingly, the number of rectangular shapes to be corrected is small, resulting in high-speed optical proximity correction.

According a second invention, there is provided a mask pattern correction process including an exposure amount determination step and a corrected shape producing step.

At the exposure amount determination step, exposure conditions for a semiconductor device fabrication process are set to a specified exposure amount which allows proper formation of a desired pattern with respect to a dense rectangular shape group constituted by dense rectangular shapes out of all rectangular shapes included in a layout design pattern. The dense rectangular shapes are such shapes each located at a distance from another rectangular shape which distance is less than a specified shape-to-shape distance.

At the corrected shape producing step, a non-dense rectangular shape group, which is constituted by non-dense rectangular shapes out of all rectangular shapes included in the layout design pattern, is determined to be an object rectangular shape group. The non-dense rectangular shapes are such shapes each located at a distance from another rectangular shape which distance is more than or equal to the specified shape-to-shape distance. Then, all the sides of the respective object rectangular shapes included in the object rectangular shape group are uniformly extended by a specified correction amount to produce corrected rectangular shapes.

According to the above process, all the sides of the respective rectangular shapes included in the non-dense rectangular shape group little affected by optical proximity effects are uniformly extended by a specified correction amount to produce corrected rectangular shapes, while setting exposure conditions to a specified amount which permits proper formation of a desired pattern with respect to the dense rectangular shape group which is significantly affected by optical proximity effects. With this arrangement, optical proximity correction can be carried out at high speed without increasing the number of base shapes after EB data conversion and without producing shapes having small level differences. Additionally, optical proximity effects, which occur in the dense rectangular shape group, can be compensated for by properly setting exposure conditions, and therefore there is no need to carry out shape correction for the dense group. Accordingly, the number of rectangular shapes to be corrected is small, resulting in high-speed optical proximity correction.

According to a third invention, there is provided a mask pattern correction process comprising a shape selection step, number-of-shapes comparison step, correction process selection step, shape correction step and shape combining step.

At the shape selection step, a dense rectangular shape group, which is constituted by dense rectangular shapes out of all rectangular shapes included in a layout design pattern, is selected and output, the dense rectangular shapes being such shapes each located at a distance from another rectangular shape which distance is less than a specified shape-to-shape distance. Also, a non-dense rectangular shape group, which is constituted by non-dense rectangular shapes out of all the rectangular shapes included in the layout design pattern, is selected and output, the non-dense rectangular shapes being such shapes each located at a distance from another rectangular shape which distance is more than and equal to the specified shape-to-shape distance.

At the number-of-shapes comparison step, the number of rectangular shapes included in the dense rectangular shape group is compared to the number of rectangular shapes included in the non-dense rectangular shape group. Then, the group having less rectangular shapes is selected from the dense and non-dense rectangular shape groups as an object rectangular shape group while selecting the group having more rectangular shapes as a non-object rectangular shape group.

At the correction process selection step, a first shape correction process is selected if the dense rectangular shape group has been selected as an object rectangular shape group at the number-of-shapes comparison step, and a second shape correction process is selected if the non-dense rectangular shape group has been selected as an object rectangular shape group at the number-of-shapes comparison step.

At the shape correction step, object rectangular shapes included in the object rectangular shape group are corrected with either the first or second correction method which has been selected at the correction process selection step to output corrected rectangular shapes. Then, exposure conditions for a semiconductor device fabrication process are set to a specified exposure amount.

At the shape combining step, the group of corrected rectangular shapes is combined with the non-object rectangular shape group to output corrected exposure data.

According to the above process, rectangular shapes included in a design pattern are divided using a specified space-to-space distance as a threshold, into the dense rectangular shape group and the non-dense rectangular shape group. Then, the numbers of rectangular shapes included in the dense and non-dense groups are compared to each other, and the rectangular shape group having a less number of shapes is selected as an object rectangular shape group. Thereafter, the shape correction process corresponding to the selected rectangular shape group is selected. In this way, the rectangular shape group having less rectangular shapes to be subjected to correction is selected, so that the number of rectangular shapes to be processed can be reduced, increases in processing time required for the subsequent generation of corrected rectangular shapes can be restricted, and high-speed correction can be ensured. Additionally, optical proximity effects, which occur in the non-object rectangular shape group can be compensated for by properly setting exposure conditions, and therefore there is no need to carry out shape correction for the non-object group.

According to a fourth invention, there is provided a mask pattern correction process in which the shape correction step described in the mask pattern correction process of the third invention is modified as follows. Specifically, in the fourth invention, the shape correction step comprises, in order to implement the first shape correction process, a first exposure amount determination step for setting exposure conditions for the semiconductor device fabrication process to a specified exposure amount necessary for the non-object rectangular shape group to form a desired pattern;

a projected line detection step for detecting projected line segments of directly opposed adjacent side portions lying on the opposed adjacent sides of every two object rectangular shapes which are close to each other and included in the object rectangular shape group; and corrected shape producing step for producing a corrected rectangular shape by parallel movement of the opposed adjacent sides on which the projected line segments lie by a specified correction amount in a direction that the object rectangular shapes are reduced, if the length of the projected line segments is more than or equal to a specified length.

In order to implement the second shape correction process, the shape correction step of the fourth invention comprises:

a second exposure amount determination step for setting exposure conditions for the semiconductor device fabrication process to a specified exposure amount which permits the non-object rectangular shape group to properly form a desired pattern; and a second corrected shape producing step for producing a corrected rectangular shape by uniformly extending, by a specified amount, all the sides of each object rectangular shape included in the object rectangular shape group.

According to the above process, if the number of rectangular shapes included in the non-dense rectangular shape group is less than the number of shapes included in the dense rectangular shape group, projected line segments of directly opposed adjacent side portions lying on the opposed adjacent sides of every two object rectangular shapes are detected, the two object rectangular shapes being close to each other and being included in the dense rectangular shape group which is an object rectangular shape group. If the length of the projected line segments is more than or equal to a specified length, the opposed adjacent sides on which the line segments lie are moved in parallel by a specified correction amount in a direction that the object rectangular shapes are reduced, whereby a corrected rectangular shape is produced. Then, exposure conditions are set to a specified exposure amount which permits the non-dense rectangular shape group which is a non-object rectangular shape group to properly form a desired pattern. With this arrangement, optical proximity correction can be carried out at high speed without increasing the number of base shapes after EB data conversion and without generating shapes including small level differences.

In addition, optical proximity effects, which occur in the non-dense rectangular shape group and in the dense rectangular shapes having the lengths of line segments less than the specified length, can be compensated for by properly setting exposure conditions, and therefore there is no need to carry out shape correction for them. Accordingly, the number of rectangular shapes to be corrected is small, resulting in high-speed optical proximity correction.

On the other hand, if the number of rectangular shapes included in the dense rectangular shape group is less than the number of shapes included in the non-dense rectangular shape group, all the sides of the respective rectangular shapes included in the non-dense rectangular shape group little affected by optical proximity effects are uniformly extended by a specified correction amount to produce corrected rectangular shapes, while setting exposure conditions to a specified amount which permits proper formation of a desired pattern with respect to the dense rectangular shape group which is significantly affected by optical proximity effects. With this arrangement, optical proximity correction can be carried out at high speed without increasing the number of base shapes after EB data conversion and without producing shapes having small level differences. Additionally, optical proximity effects, which occur in the dense rectangular shape group, can be compensated for by properly setting exposure conditions, and therefore there is no need to carry out shape correction for the dense group. Accordingly, the number of rectangular shapes to be corrected is small, resulting in high-speed optical proximity correction.

According to a fifth invention, there is provided a photomask having a mask pattern corrected by any one of the mask pattern correction processes as described in the first, second, third and fourth inventions.

With the above photomask, a pattern can be formed on a semiconductor device substrate by use of a mask pattern capable of effectively compensating for optical proximity effects, so that pattern defects on the semiconductor device substrate can be reduced.

According to a sixth invention, there is provided a semiconductor integrated circuit device fabricated by use of a photomask having a mask pattern corrected by any one of the mask pattern correction processes as describer in the first, second, third and fourth inventions.

In the above semiconductor integrated circuit device, a pattern can be formed on a semiconductor device substrate by use of a mask pattern capable of effectively compensating for optical proximity effects, so that even if the mask pattern is made smaller in size, pattern defects on the semiconductor device substrate can be reduced and, in consequence, higher integrity can be easily attained.

BRIEF EXPLANATION OF THE DRAWINGS

FIG. 1 is a flow chart of a mask pattern correction process according to an embodiment of the invention.

DESCRIPTION OF PREFERRED EMBODIMENTS

Figure 2A:
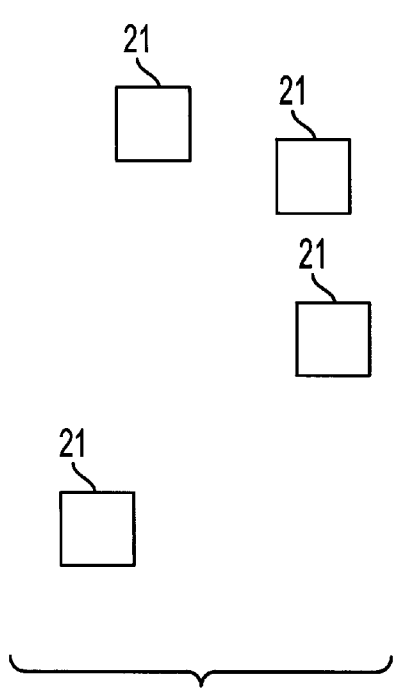
FIGS. 2(a) to 2(d) are schematic diagrams illustrating the details of a shape selection step 11 according to the embodiment of the invention.

Referring now to the accompanying drawings, a preferred embodiment of the invention will be described below.

FIG. 1 is a flow chart depicted for explaining a mask pattern correction process according to an embodiment of the invention. In this mask pattern correction process, a shape selection step 11, number of shapes comparison step 12, correction process selection step 13, and shape correction step 14, shape combining step 15 are effected based on an input pattern to produce and output a corrected pattern which is corrected exposure data.

In FIG. 1, the shape selection step 11 is a step in which a dense rectangular shape group is selected and output. This group is constituted by dense rectangular shapes selected out of all rectangular shapes included in an input mask pattern (i.e., layout design pattern), the dense rectangular shapes being such shapes each located at a distance from another rectangular shape which distance is less than a specified shape-to-shape distance. In the step 11, a non-dense shape group is also selected and output, which is constituted by non-dense rectangular shapes selected out of all rectangular shapes included in an input mask pattern, the non-dense rectangular shapes being such shapes each located at a distance from another rectangular shape which distance is more than or equal to the specified shape-to-shape distance. Concretely, the shape selection step 11 is for dividing the shapes of a mask pattern using a specified shape-to-shape distance as a threshold into a dense rectangular shape group and a non-dense rectangular shape group, the former being constituted by shapes having shape-to-shape distances less than a specified value, while the latter is constituted by shapes having shape-to-shape distances more than or equal to the specified value.

At the number of shapes comparison step 12, the number of rectangular shapes included in the dense rectangular shape group is compared to the number of rectangular shapes included in the non-dense rectangular shape group, the dense and non-dense groups being output from the shape selection step 11. Then, the group having less rectangular shapes is selected from the idense and non-dense groups and determined as an object rectangular shape group while the group having more rectangular shapes is determined as a non-object rectangular shape group to output.

At the correction process selection step 13, if the dense rectangular shape group is determined to be an object rectangular shape group at the number-of-shapes comparison step 12, the first shape correction process is selected. On the other hand, if the non-dense rectangular shape group is determined to be an object rectangular shape group, the second shape correction process is selected.

The shape correction step 14 is a step in which object rectangular shapes included in the object rectangular shape group are corrected using either the first or second shape correction process which has been selected at the correction process selection step 13 and the corrected rectangular shapes are output. Also, exposure conditions for a semiconductor device fabrication process are set to a specified exposure amount at this step 14.

At the shape combining step 15, a corrected rectangular shape group that is constituted by the corrected rectangular shapes produced at the shape correction step 14 is combined with the non-object rectangular shape group to output as corrected exposure data.

Figure 2B:
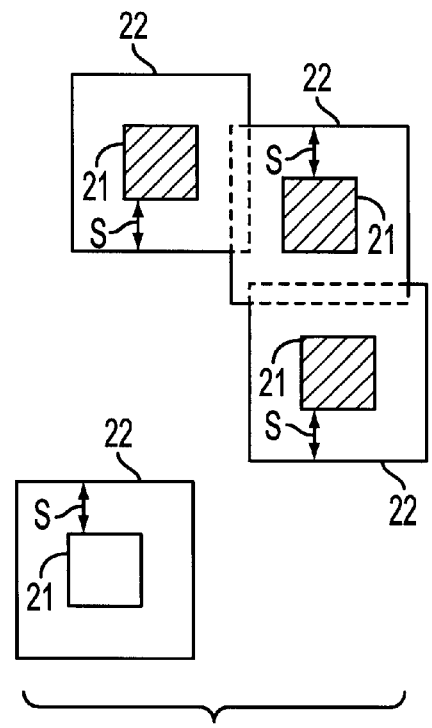
Figure 2C:
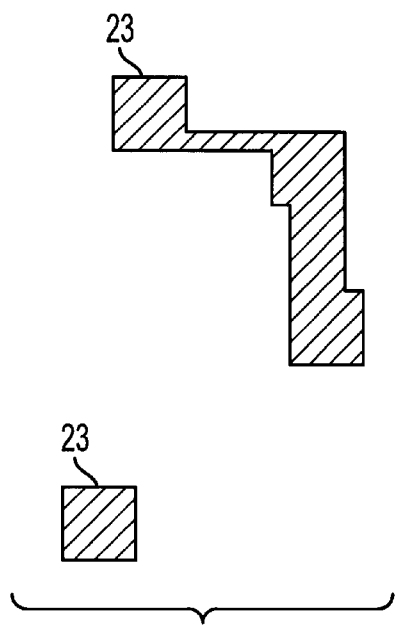
Figure 2D:
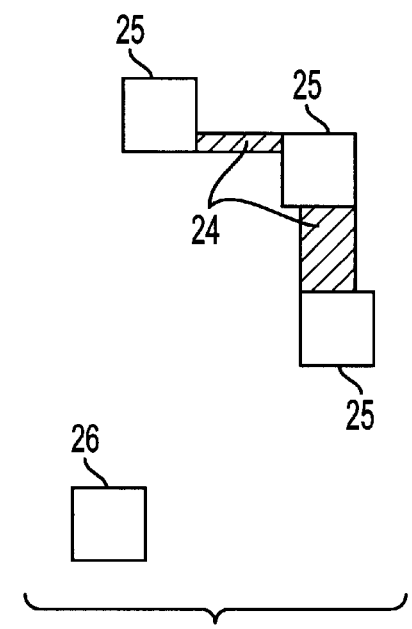

FIGS. 2(a) to 2(d) are schematic diagrams illustrating the details of the shape selection step shown in FIG. 1. In FIG. 2(a), reference numeral 21 designates each of a plurality of rectangular shapes included in a design pattern. In FIG. 2(b), reference numeral 22 designates each of enlarged rectangular shapes obtained by enlarging the rectangular shapes 21 by the amount corresponding to a specified space-to-space distance S. In FIG. 2(c), reference numeral 23 designates a reduced shape obtained by reducing partially overlapped rectangular shapes 22 by the amount corresponding to the specified space-to-space distance S. In FIG. 2(d), reference numeral 24 designates rectangular shapes resulted from the calculation of the difference between the reduced shape 23 and its associated input mask pattern, i.e., the rectangular shapes 21. Reference numeral 25 designates a dense rectangular shape group constituted by the rectangular shapes 21 which are in contact with the rectangular shapes 24, while reference numeral 26 designates a non-dense rectangular shape group constituted by the rectangular shape 21 which is not contact with the rectangular shapes 24.

Figure 3A:
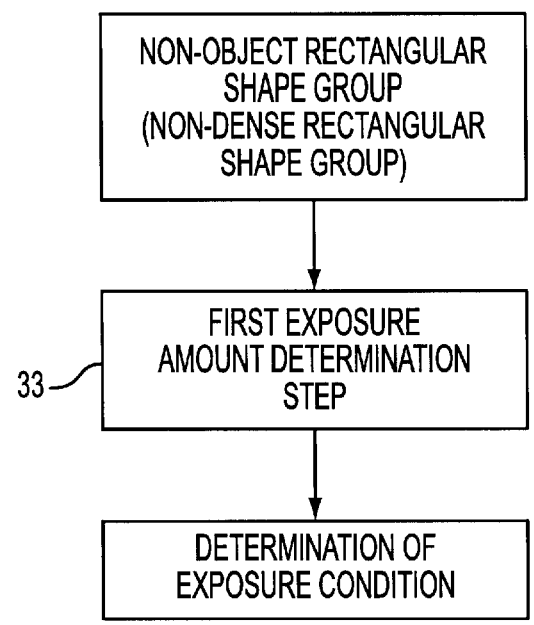
FIGS. 3(a) and 3(b) are flow charts of a first shape correction process according to the embodiment of the invention.
Figure 3B:
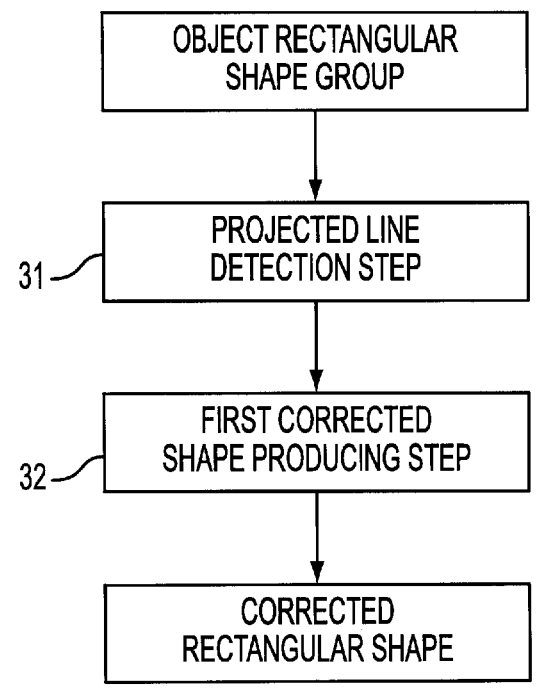

FIGS. 3(a) and 3(b) are flow charts depicted to explain the processing for executing a first shape correction process within the shape correction step 14. As shown in FIG. 3(a), exposure conditions are determined so as to be optimum for a non-object rectangular shape group (which is the dense rectangular shape group in this case) at a first exposure amount determination step 33. As shown in FIG. 3(b), the object rectangular shape group is corrected to output corrected rectangular shapes at a projected line detection step 31 and first corrected shape producing step 32.

In FIG. 3(a), the first exposure amount determination step 33 is a step in which exposure conditions for semiconductor device fabrication are set to a specified exposure amount necessary for the non-object rectangular shape group to form a desired pattern.

In FIG. 3(b), the projected line detection step 31 is a step for inputting the object rectangular shape group (which is the dense rectangular shape group in this case) which has been output at the number of shapes comparison step 12 and for detecting the projected line segments of directly opposed adjacent side portions lying on the opposed adjacent sides of two object rectangular shapes which are close to each other and included in the object rectangular shape group. More concretely, the projected line detection step 31 is arranged as follows. The opposed adjacent sides of two close object rectangular shapes which are included in the object rectangular shape group are moved in parallel, the initial distance between the opposed adjacent sides being less than a specified shape-to-shape distance. This movement is carried out in a direction perpendicular to the opposed adjacent sides until the opposed adjacent sides overlap each other. Then, the line segment of the overlapped portion is detected as the projected line segments.

The first corrected shape producing step 32 is a step in which if the length of the projected line segments detected at the projected line detection step 31 is more than or equal to a specified length, the opposed adjacent sides on which the detected line segments lie are moved in parallel by a correction amount corresponding to a specified width in a direction that the object rectangular shapes are reduced, thereby to produce a corrected rectangular shape. More specifically, the step 32 is such that in a case where two object rectangular shapes are close to each other, its two opposed sides are moved backward, that is, the opposed portions are deleted, thereby increasing the gap between the two object rectangular shapes.

Figure 4A:
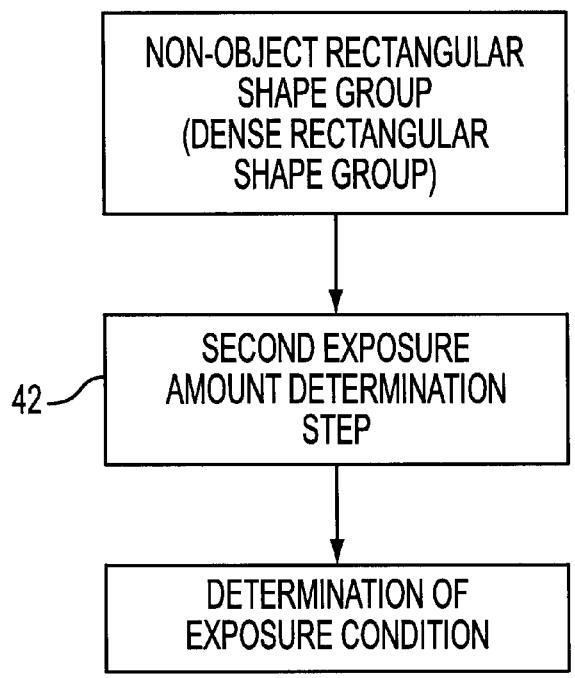
FIGS. 4(a) and 4(b) are flow charts of a second shape correction process according to the embodiment of the invention.
Figure 4B:
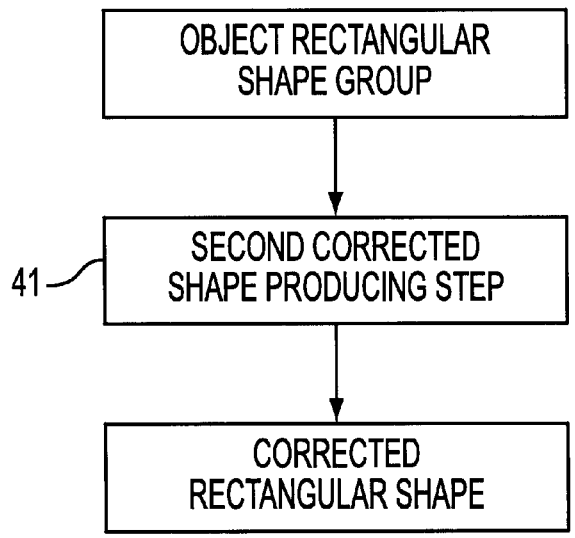

FIGS. 4(a), 4(b) are flow chart s for explaining the processing for executing a second shape correction process within the shape correction step 14 of the embodiment of the invention. As shown in FIG. 4(a), exposing conditions are determined so as to be optimum for a non-object rectangular shape group (which is the dense shape group, in this case) at a second exposure determination step 42. As shown in FIG. 4(b), the object rectangular group is corrected to output corrected rectangular shapes at a second corrected shape producing step 41.

In FIG. 4(a), the second exposure determination step 42 is a step in which exposure conditions for semiconductor device fabrication are set to a specified exposure amount that is necessary for the non-object rectangular shape group to form a desired pattern.

In FIG. 4(b), the second corrected shape producing step 41 is a step in which the object rectangular shape group (which is the non-dense rectangular shape group in this case) which has been output from the number of shapes comparison step 12 is input and all the sides of each rectangular shape included in the input object rectangular shape group are extended uniformly by a specified correction amount to produce a corrected rectangular shape.

The above uniform side extension means that all the sides of a rectangular shape are respectively moved outward by the same amount irrespective of the dimension ratio of the longitudinal sides to the lateral sides of the original rectangular shape, so that a new rectangular shape is created. For instance, where the lateral side and longitudinal side of an original rectangular shape are represented by a and b respectively, the lateral and longitudinal sides of the enlarged shape, which is obtained by uniformly extending all the sides of the original rectangular shape by an amount c, are c+a+c and c+b+c, respectively.

In the above case, the lateral and longitudinal sides of the rectangular shapes which constitute a layout pattern are arranged in parallel with x-axis and y-axis, respectively.

Figure 5A:
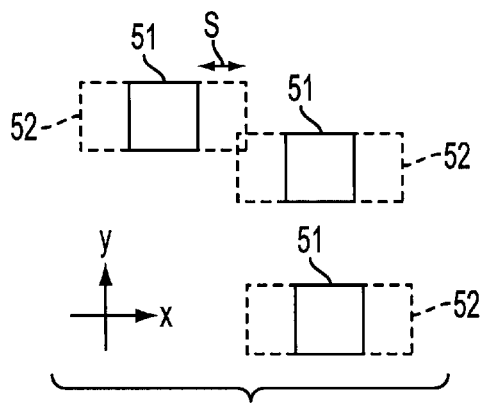
FIGS. 5(a) to 5(e) are schematic diagrams illustrating the details of a projected line detection step according to the embodiment of the invention.
Figure 5B:
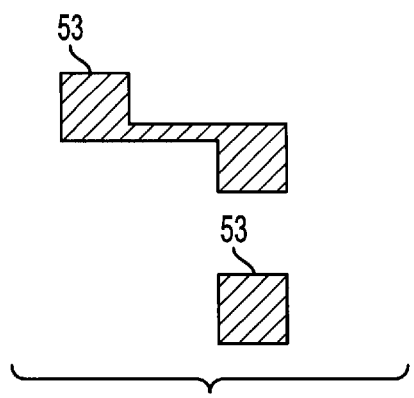
Figure 5C:
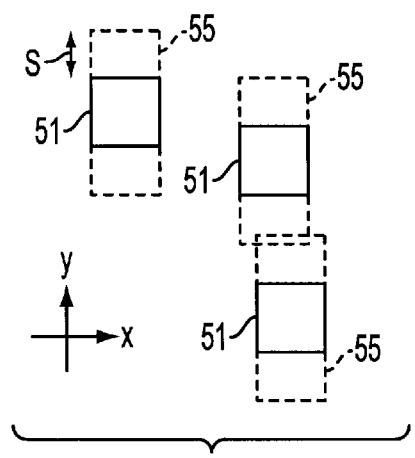
Figure 5D:
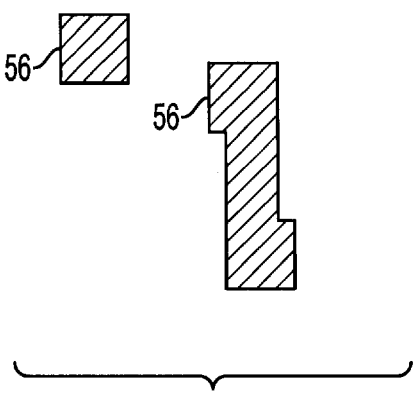
Figure 5E:
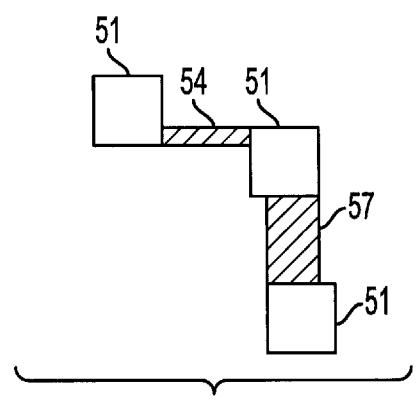

FIGS. 5(a) to 5(e) schematically illustrate the details of the projected line detection step 31 according to the embodiment of the present invention. In FIG. 5(a), reference numeral 51 designates the object rectangular shape group (which is the dense rectangular shape group 25 in this case) output from the number of shapes comparison step 12, and reference numeral 52 designates each enlarged shape obtained by enlargement of the object rectangular shape group 51 by the amount corresponding to the specified shape-to-shape distance S only in the x direction. In FIG. 5(b), reference numeral 53 designates a reduced shape obtained by reducing the enlarged shapes 52 by the amount corresponding to the specified shape-to-shape distance S. In FIG. 5(e), reference numeral 54 designates a projected shape as a result of calculation of the difference between the reduced shape 53 and the object rectangular shape group 51. This projected shape is obtained by connecting the ends of two projected line segments lying on the two opposed adjacent sides of two close object rectangular shapes, using two parallel line segments.

In FIG. 5(c), reference numeral 55 designates each enlarged shape obtained by enlarging the object rectangular shape group 51 by the amount corresponding to the specified shape-to-shape distance S only in the y direction. In FIG. 5(d), reference numeral 56 designates a reduced shape obtained by reducing the enlarged shapes 55 by the amount corresponding to the specified shape-to-shape distance S. In FIG. 5(e), reference numeral 57 designates a projected shape as a result of calculation of the difference between the reduced shape 56 and the object rectangular shape group 51. This projected shape is obtained by connecting the ends of two projected line segments lying on the two opposed adjacent sides of two close object rectangular shapes, using two parallel line segments.

Figure 6A:
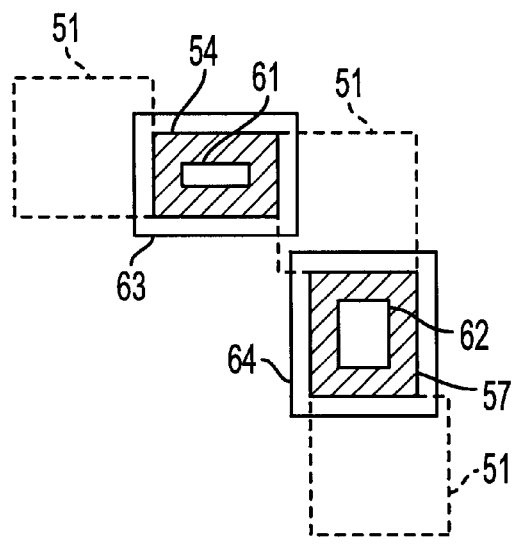
FIGS. 6(a) to 6(c) are schematic diagrams illustrating the details of a first corrected shape producing step 32 according to the embodiment of the invention.

FIG. 6 schematically illustrates the details of the first corrected shape producing step 32 shown in FIG. 3(b) according to the embodiment of the invention. In FIG. 6(a), reference numerals 61, 62 designate reduced shapes obtained by reducing the projected shapes 54, 57 shown in FIG. 5(e), respectively, by the amount corresponding to a first specified shape size. Reference numerals 63, 64 designate enlarged rectangular shapes obtained by enlarging the rectangular shapes 61, 62, respectively, by the amount corresponding to a second specified shape size.

By enlarging, by the amount corresponding to the second specified shape size, the rectangular shapes 61, 62 which has been obtained from reduction of the projected shapes 54, 57 by the amount corresponding to the first specified shape size, it is determined whether or not the length of a projected light segments is less than a specified length. If the length of the projected line segments is less than the specified length, no corrections will be made.

Figure 6B:
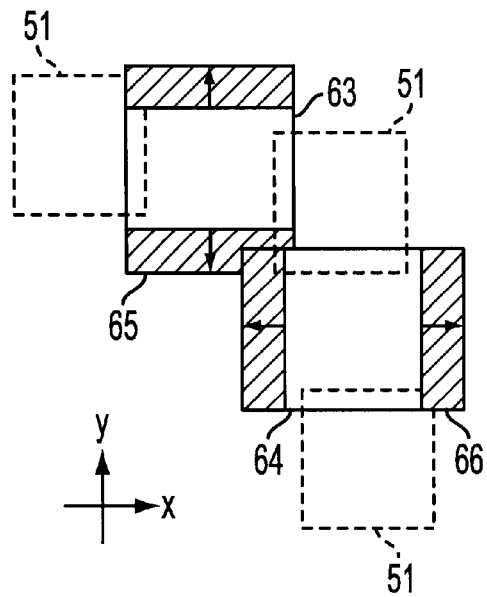
Figure 6C:
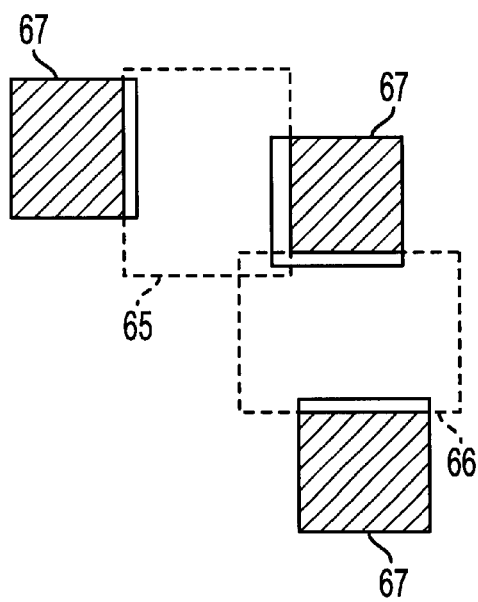

In FIG. 6(b), reference numeral 65 designates a rectangular shape obtained from enlargement of the rectangular shape 63 by the amount corresponding to the first specified shape size in the y direction (i.e., a direction orthogonal to the direction in which the object rectangular shapes are aligned). Reference numeral 66 designates a rectangular shape obtained from enlargement of the rectangular shape 64 by the amount corresponding to the first specified shape size in the x direction (i.e., a direction orthogonal to the direction in which the object rectangular shapes are aligned). In FIG. 6(c), reference numeral 67 designates each corrected rectangular shape resulting from deletion of the overlapped portions where each rectangular shape 51 overlaps with the rectangular shapes 65 or 66. Each of these corrected rectangular shapes 67 is formed by parallel movement of the opposed adjacent sides on which the projected line segments lie by a specified correction amount in a direction in which the rectangular shapes are reduced.

Figure 7:
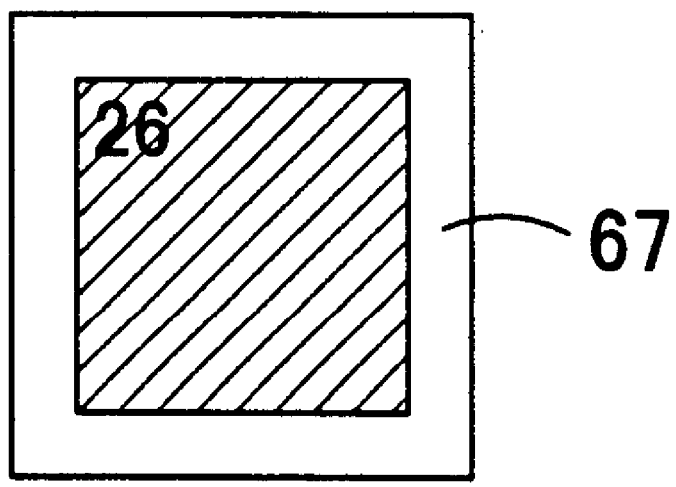
FIG. 7 is a schematic diagram illustrating the details of a second corrected shape producing step 41 according to the embodiment of the invention.

FIG. 7 schematically illustrates the details of the second corrected shape producing step 41 shown in FIG. 4(b) according to the embodiment of the invention. In FIG. 7, reference numeral 67 designates a rectangular shape obtained by uniformly enlarging all the sides of the respective rectangular shapes included in an input object rectangular shape group (which is the non-dense rectangular shape group 26 in this example) which has been output from the number of shapes comparison step 12.

Reference is made to FIGS. 1 to 7 to concretely explain the contents of the mask pattern correction process arranged as described above.

Firstly, a design pattern is processed at the shape selection step 11 of FIG. 1. At the shape selection step 11, the rectangular shapes 21 included in the design pattern are divided, with the specified shape-to-shape distance serving as a threshold, into two shape groups, that is, the dense rectangular shape group and the non-dense rectangular shape group. Therefore, the rectangular shapes 22, reduced shape 23 and rectangular shapes 24 are generated as intermediate shapes, by performing logical operations such as enlargement and reduction. Then, the two shape groups are output, which are the dense rectangular shape group 25 having shape-to-shape distances less than the specified distance S and the non-dense rectangular shape group 26 having shape-to-shape distances more than or equal to the specified distance S.

Then, at the number of shapes comparison step 12 shown in FIG. 1, the number M1 of rectangular shapes included in the dense rectangular shape group 25 is compared to the number M2 of rectangular shapes included in the non-dense rectangular shape group 26. If it has been found, from the result of the comparison, that M1<M2, the dense rectangular shape group 25 is output as the object rectangular shape group 51, while the non-dense rectangular shape group 26 is output as the non-object rectangular shape group. If it has been found M1?M2, the non-dense rectangular shape group 26 is output as the object rectangular shape group 51 while the dense rectangular shape group 25 is output as the non-object rectangular shape group.

Then, at the correction process selection step 13, the object rectangular shape group 51 output from the number of shapes comparison step 12 of FIG. 1 is input. If the object rectangular shape group 51 is the dense rectangular shape group 25, the first shape correction process (see FIG. 3) is selected. On the other hand, if the object rectangular shape group 51 is the non-dense rectangular shape group 26, then, the second shape correction process (see FIG. 4) is selected.

At the shape correction step 14 shown in FIG. 1, shape modification is performed on the rectangular shapes in accordance with the shape correction process which has been selected at the correction process selection step 13.

If the first shape correction process is selected at the above correction process selection step 13, the object rectangular shape group 51 is input to the projected line detection step of FIG. 3.

The object rectangular shape group 51 input to the projected line detection step 31 is enlarged by a specified amount only in the x direction to produce the rectangular shapes 52 which, in turn, are reduced by a specified amount thereby producing the rectangular shape 53. Through this enlargement/reduction processing, a rectangular shape which consists of the area between the opposed adjacent sides of opposed close shapes is added, the distance between the opposed adjacent sides being less than a specified value. Then, the difference between the rectangular shape 53 and the object rectangular shape group 51 is calculated thereby to output the projected shape 54.

The object rectangular shape group 51 which has been input to the projected line detection step 31 is enlarged by a specified amount only in the y direction to produce the rectangular shapes 55 which are then reduced by a specified amount thereby producing the rectangular shape 56. The difference between the rectangular shape 56 and the object rectangular shape group 51 is calculated to output as the projected shape 57.

Thereafter, the projected shapes 54, 57 produced at the projected line detection step 31 are input to the corrected shape producing step 32 at which the projected shapes 54, 57 are reduced by the amount corresponding to the first specified shape size thereby producing the rectangular shapes 61, 62, respectively. If the lengths of the respective short sides of the rectangular shapes 61, 62 are less than one half of the first specified shape size, these rectangular shapes will be vanished. If the rectangular shapes 61, 62 are not vanished. after the above reduction processing, they are then enlarged by the amount corresponding to the second specified size so that the rectangular shapes 63, 64 are produced.

Then, the rectangular shape 63 is enlarged in the y direction by the amount corresponding to the first specified size to produce the rectangular shape 65 while the rectangular shape 64 is enlarged in the x direction by the amount corresponding to the first specified size to produce the rectangular shape 66.

The corrected rectangular shapes 67 are then produced by subtracting the overlapping portions from the rectangular shapes 51, the overlapping portions being where the rectangular shapes 51 overlap with the rectangular shapes 65 or 66.

If the second shape correction process has been selected at the correction process selection step 13, the object rectangular shape group 51 is uniformly enlarged by a specified correction amount at the second corrected shape producing step 41 shown in FIG. 4 thereby producing the corrected rectangular shape 67.

Lastly, at the shape combining step 15, the non-object rectangular shape group extracted at the first number of shapes comparison step 12 is combined with the corrected rectangular shapes 67 produced at the first corrected shape producing step 32 or the second corrected shape producing step 41 by OR logical operation, to generate corrected exposure data.

According to this embodiment, shape-to-shape distance measurements by enlargement and reduction of rectangular shapes and comparison between the numbers of shapes are carried out to divide rectangular shapes into the dense rectangular shape group and the non-dense rectangular shape group and then perform shape correction on either of the groups, so that the number of rectangular shapes to be subjected to correction can be reduced. Further, the numbers of shapes in the two groups are compared and the group having a less number of shapes is selected as the group of object rectangular shapes for correction, so that increases in processing time can be restricted compared to other correction process in which correction is equally made to all geometric shapes contained in a design pattern.

In this embodiment, if the dense rectangular shape group including densely placed shapes is selected as object rectangular shapes for correction, intermediate shapes are newly produced between the object rectangular shapes by enlargement and reduction in specified directions and intermediate shapes having widths less than a specified value are deleted by reduction and enlargement. The intermediate shapes which have not been deleted are enlarged by a specified correction amount so that if the length of the projected line segments is more than or equal to a specified length, the parallel movement of the opposed adjacent sides toward the inner side of the shapes will be carried out and if the length of the projected line segments is less than the specified length, processing without correction will be performed. As a result, not only can small level differences generated after correction be prevented but also defect inspection can be made by use of a conventional inspection technique without causing any problems.

Further, since new rectangular shapes are produced by parallel movement of the opposed adjacent sides in a direction that the rectangular shapes are reduced, only when the length of the projected line segments is more than or equal to a specified length, corrections can be made without increasing vertices so that the pattern after correction is not represented by polygons of higher order than those of the initial design pattern. In consequence, an increased number of base shapes to be separated at the time of conversion into EB data can be avoided.

Additionally, in this embodiment, it non-densely placed rectangular shapes are selected as object rectangular shapes for correction, all the sides of the respective object rectangular shapes are uniformly extended by a specified amount and the exposure light density for the semiconductor device fabrication process is reduced to a value suited for densely placed rectangular shapes. Thus, corrections can be made on the dense rectangular shape group having many rectangular shapes, simply by altering exposure conditions for the exposure system, so that the load imposed on the CAD system during correction can be reduced.

Although the foregoing embodiment is arranged such that the adjacent sides of close rectangular shapes are moved back or all the sides of isolated rectangular shapes are extended, depending on the number of rectangular shapes included in each of the rectangular shape groups, another alternative is possible. This alternative process is carried out in the similar manner in which all rectangular shapes are enlarged beforehand and after the amount of exposure is properly adjusted. in this condition, the backward movement of the opposed adjacent sides is carried out whereby the non-adjacent sides are extended.

Specifically, the foregoing embodiment is arranged such that the opposed adjacent sides of close rectangular shapes are moved back by parallel movement. This is carried out on condition that the exposure amount is set to such an amount that permits proper formation of isolated patterns. On the other hand, if the set exposure amount is suited for a close pattern, the non-adjacent sides of close rectangular shapes and isolated rectangular shapes tend to reduce after transferring. For compensating for such reduction, correction patterns must be added. Correction patterns for compensation can be added by applying the technique of the present invention to a pattern which has been enlarged beforehand.

In short, a correction pattern can be added to each non-adjacent side by a process in which the opposed adjacent sides are moved back after enlargement.

FIGS. 8(a) to 8(d) depict a procedure in which an exposure amount suited for a close pattern is set and correction patterns are added to the non-adjacent sides of close rectangular shapes.

Figure 8A:
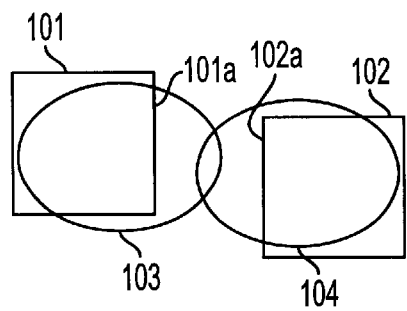
FIGS. 8(a) to 8(d) are schematic diagrams illustrating another example of the corrected shape producing step according to the embodiment of the invention.

FIG. 8(a) shows two rectangular shapes 101 and 102 close to each other and two patterns 103, 104 formed from the close rectangular shapes 101, 102 with an exposure amount which permits proper formation of isolated patterns. In FIG. 8(a), the formed patterns 103, 104 are substantially close to the rectangular shapes 101, 102 at the rectangular shape's sides which are not close to other rectangular shapes. However, the patterns 103, 104 greatly extrude from the opposed adjacent sides 101a, 102a respectively into the space between the opposed adjacent sides 101a and 102a.

Figure 8B:
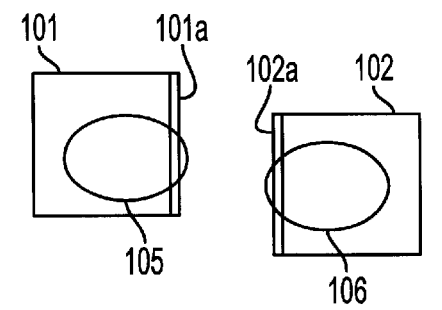

FIG. 8(b) shows the two rectangular shapes 101 and 102 close to each other and two patterns 105, 106 formed from the close rectangular shapes 101, 102 with an exposure amount which permits proper formation of portions (indicated by thick lines) on the opposed adjacent sides 101a, 102a of the rectangular shapes 101, 102. In FIG. 8(b), the formed patterns 105, 106 are substantially close to the rectangular shapes 101, 102 at the rectangular shape's sides 101a, 102a which are opposed and adjacent to each other. However, the patterns 105, 106 greatly retract from the rectangular shapes 101, 102 respectively at the sides which are not close to other rectangular shapes.

Figure 8C:
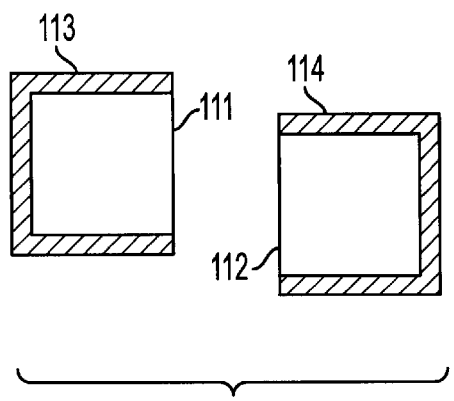

FIG. 8(c) shows rectangular shapes 113, 114 which are formed by adding a correction pattern to each of two close rectangular shapes 111, 112, the correction pattern having the shape of  (Japanese letter Katakana) enclosing three sides of each rectangular shape 111 or 112 which are not close to other rectangular shapes.

Figure 8D:
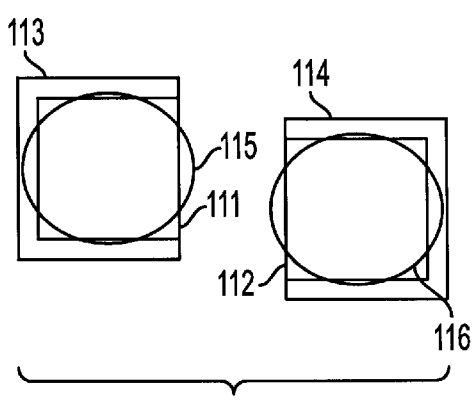
Figure 9A:
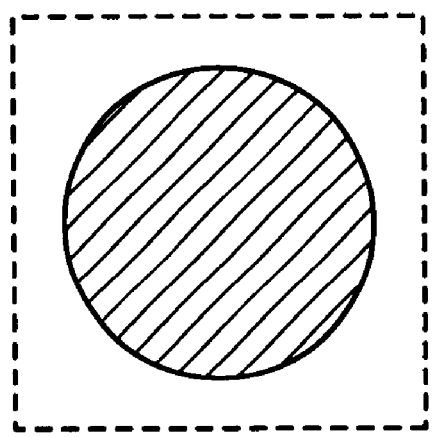
FIGS. 9(a) and 9(b) are schematic diagrams illustrating one example of optical proximity effects.
Figure 9B:
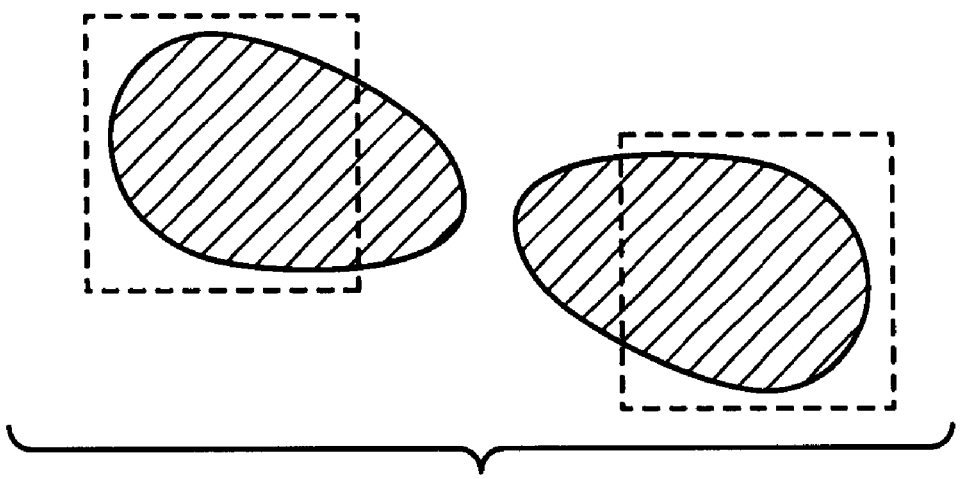
Figure 10A:
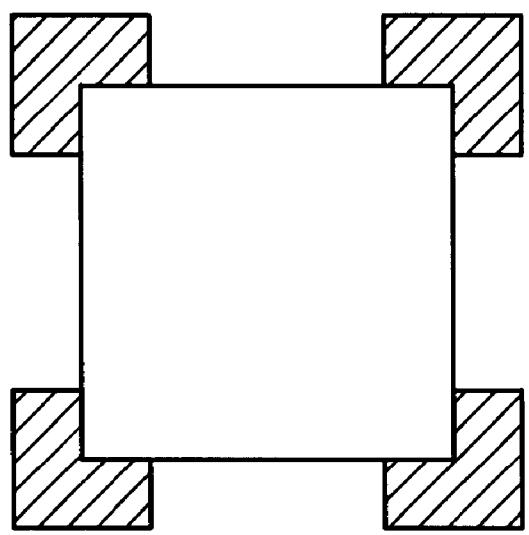
FIGS. 10(a) and 10(b) are schematic diagrams illustrating one example of prior art optical proximity corrections.
Figure 10B:
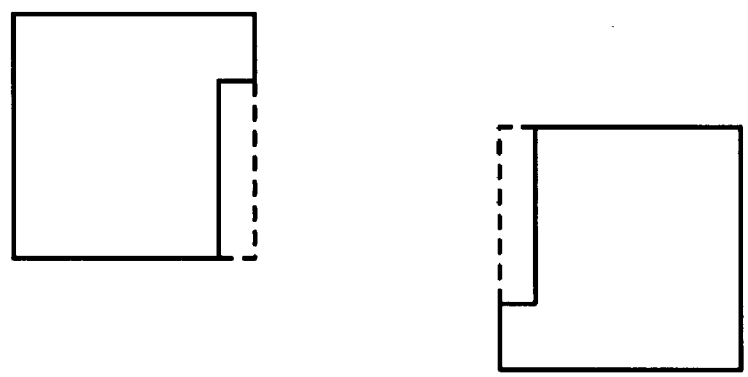
Figure 11A:
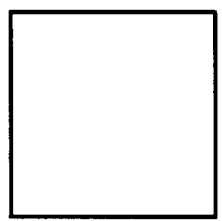
FIGS. 11(a) to 11(d) are schematic diagrams illustrating one example of processes for dividing into base shapes.
Figure 11B:
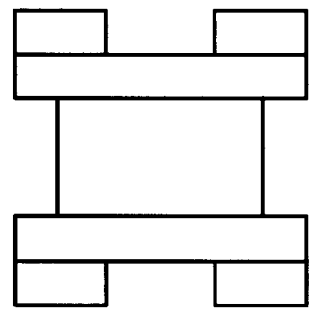
Figure 11C:
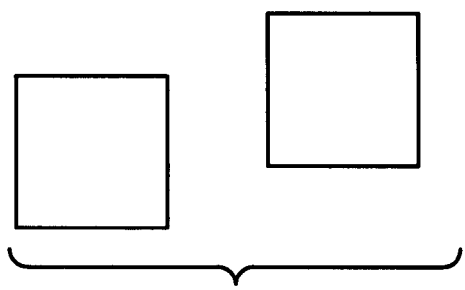
Figure 11D:
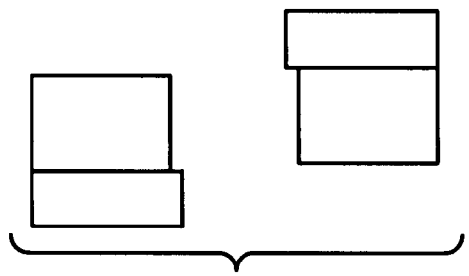

FIG. 8(d) shows patterns 115, 116 formed by use of the rectangular shapes 113, 114 shown in FIG. 8(c) with the same exposure conditions as those of the case shown in FIG. 8(b).

In the case shown in FIG. 8(d), by virtue of the two close rectangular shapes 113, 114 obtained by enlarging the two close rectangular shapes 101, 102 at the parts which are not close to other rectangular shapes, patterns are formed in a more adequate condition compared to the two initial rectangular shapes 111, 112.

While the forgoing embodiment is arranged such that all rectangular shapes are divided into the dense rectangular shape group and the non-dense rectangular shape group and pattern correction is performed on either of them which has less rectangular shapes, it is also possible to perform pattern correction on the dense rectangular shape group alone or the non-dense rectangular shape group alone, irrespective of the number of rectangular shapes.

The alternative case also has the advantage that the number of rectangular shapes to be subjected to correction can be lessened compared to the conventional cases where all rectangular shapes undergo pattern correction. Therefore, the correction process can be shortened to enable high-speed correction.

It should be noted that the photomask of the embodiment of the invention has a mask pattern corrected by the mask pattern correction process described in the foregoing embodiment. With this arrangement, a pattern can be formed on a semiconductor device substrate using a mask pattern which effectively compensates for optical proximity effects and therefore pattern defects on the semiconductor device substrate can be reduced.

The semiconductor integrated circuit of the embodiment of the invention is fabricated by use of a photomask having a mask pattern corrected by the mask pattern correction process which has been described in the foregoing embodiment. With this arrangement, a pattern can be formed on a semiconductor device substrate using a mask pattern which effectively compensates for optical proximity effects and therefore even if the mask pattern is reduced in size, pattern defects on the semiconductor device substrate can be reduced and higher integrity can be easily achieved.

What is claimed is:

1. A mask pattern correction process comprising:

an exposure amount determination step for setting exposure conditions for a semiconductor device fabrication process to a specified exposure amount which allows proper formation of a desired pattern with respect to a non-dense rectangular shape group constituted by non-dense rectangular shapes out of all rectangular shapes included in a layout design pattern, the non-dense rectangular shapes being such shapes each located at a distance from another rectangular shape which distance is more than or equal to a specified shape-to-shape distance;

a projected line detection step in which a dense rectangular shape group, which is constituted by dense rectangular shapes out of all rectangular shapes included in the layout design pattern, is determined to be; an object rectangular shape group, the dense rectangular shapes being such shapes each located at a distance from another rectangular shape which distance is less than the specified shape-to-shape distance, and in which projected line segments of directly opposed adjacent side portions lying on the opposed adjacent sides of every two object rectangular shapes are detected, said two object rectangular shapes being close to each other and being included in the object rectangular shape group; and a corrected shape producing step for producing a corrected rectangular shape by parallel movement of said opposed adjacent sides on which said projected line segments lie by a specified amount in a direction that said object rectangular shapes are reduced, if the length of the projected line segments is more than or equal to a specified length.

2. A photomask having a mask pattern corrected by the mask pattern correction process as defined in claim 1.

3. A semiconductor integrated circuit device fabricated by use of a photomask having a mask pattern corrected by the mask pattern correction process as defined in claim 1.

4. A mask pattern correction process comprising:

an exposure amount determination step for setting exposure conditions for a semiconductor device fabrication process to a specified exposure amount which allows proper formation of a desired pattern with respect to a dense rectangular shape group constituted by dense rectangular shapes out of all rectangular shapes included in a layout design pattern, the dense rectangular shapes being such shapes each located at a distance from another rectangular shape which distance is less than a specified shape-to-shape distance; and a projected line detection step in which a non-dense rectangular shape group, which is constituted by non-dense rectangular shapes out of all rectangular shapes included in a layout design pattern, is determined to be an object rectangular shape group, the non-dense rectangular shapes being such shapes each located at a distance from another rectangular shape which distance is more than and equal to the specified shape-to-shape distance, and in which all the sides of each object rectangular shape included in said object rectangular shape group are uniformly extended by a specified correction amount to produce a corrected rectangular shape.

5. A photomask having a mask pattern corrected by the mask pattern correction process as defined in claim 4.

6. A semiconductor integrated circuit device fabricated by use of a photomask having a mask pattern corrected by the mask pattern correction process as defined in claim 4.

7. A mask pattern correction process comprising:

a shape selection step for selecting and outputting a dense rectangular shape group, which is constituted by dense rectangular shapes out of all rectangular shapes included in a layout design pattern, said dense rectangular shapes being such shapes each located at a distance from another rectangular shape which distance is less than the specified shape-to-shape distance, and selecting and outputting a non-dense rectangular shape group, which is constituted by non-dense rectangular shapes out of all the rectangular shapes included in the layout design pattern, the non-dense rectangular shapes being such shapes each located at a distance from another rectangular shape which distance is more than and equal to the specified shape-to-shape distance;

a number-of-shapes comparison step for making comparison between the number of rectangular shapes included in said dense rectangular shape group and the number of rectangular shapes included in said non-dense rectangular shape group and selecting either of the groups which has less rectangular shapes as an object rectangular shape group while selecting either of the groups which has more rectangular shapes as a non-object rectangular shape group;

a correction process selection step for selecting a first shape correction process if the dense rectangular shape group has been selected as an object rectangular shape group at the number-of-shapes comparison step, and selecting a second shape correction process if the non-dense rectangular shape group has been selected as an object rectangular shape group at the number-of-shapes comparison step;

a shape correction step for correcting object rectangular shapes included in the object rectangular shape group with either of the first and second correction methods which has been selected at said correction process selection step to output corrected rectangular shapes and for setting exposure conditions for a semiconductor device fabrication process to a specified exposure amount; and a shape combining step for combining the group of corrected rectangular shapes with said non-object rectangular shape group to output corrected exposure data.

8. A photomask having a mask pattern corrected by the mask pattern correction process as defined in claim 7.

9. A semiconductor integrated circuit device fabricated by use of a photomask having a mask pattern corrected by the mask pattern correction process as defined in claim 7.

10. A mask pattern correction process according to claim 3, wherein said shape correction step comprising, in order to implement the first shape correction process, a first exposure amount determination step for setting exposure conditions for the semiconductor device fabrication process to the specified exposure amount necessary for the non-object rectangular shape group to form a desired pattern;

a projected line detection step for detecting projected line segments of directly opposed adjacent side portions lying on the opposed adjacent sides of every two object rectangular shapes which are close to each other and included in said object rectangular shape group; and corrected shape producing step for producing a corrected rectangular shape by parallel movement of the opposed adjacent sides on which said projected line segments lie by a specified correction amount in a direction that said object rectangular shapes are reduced, if the length of said projected line segments is more than or equal to a specified length;

wherein said shape correction step comprising, in order to implement the second shape correction process, a second exposure amount determination step for setting exposure conditions for the semiconductor device fabrication process to the specified exposure amount which permits the non-object rectangular shape group to properly form a desired pattern; and a second corrected shape producing step for producing a corrected rectangular shape by uniformly extending, by a specified correction amount, all the sides of each object rectangular shape included in said object rectangular shape group.

11. A photomask having a mask pattern corrected by the mask pattern correction process as defined in claim 10.

12. A semiconductor integrated circuit device fabricated by use of a photomask having a mask pattern corrected by the mask pattern correction process as defined in claim 10.

* * * * *